US006484116B1

(12) United States Patent
Yokoyama

(10) Patent No.: US 6,484,116 B1
(45) Date of Patent: Nov. 19, 2002

(54) PROGRAM EXECUTING SYSTEM FOR SEMICONDUCTOR TESTING EQUIPMENT

(75) Inventor: Masaru Yokoyama, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/574,727

(22) Filed: May 18, 2000

(30) Foreign Application Priority Data

May 21, 1999 (JP) .......................................... 11-141090

(51) Int. Cl.[7] ......................... G01R 27/28; G01R 31/00
(52) U.S. Cl. ....................................................... 702/119
(58) Field of Search .......................................... 702/123

(56) References Cited

U.S. PATENT DOCUMENTS 5,434,805 A * 7/1995 Iwasaki ...................... 364/580
5,555,417 A * 9/1996 Odnert et al. ............... 395/700
5,828,985 A * 10/1998 Sauer et al. ................ 702/102
5,951,704 A * 9/1999 Sauer et al. ................ 714/736
6,125,460 A * 9/2000 Sim ........................... 714/718
6,308,320 B1 * 10/2001 Burch ......................... 717/17
6,308,322 B1 * 10/2001 Serocki et al. .............. 712/240

* cited by examiner

*Primary Examiner*—John S. Hilten
*Assistant Examiner*—Aditya Bhat
(74) *Attorney, Agent, or Firm*—Dellett & Walters

(57) ABSTRACT

The present invention discloses a program executing system for semiconductor testing equipment that, at the time of compiling and executing the two device test programs including a common program specification command, executes the common program based on an intermediate code inserted at a position corresponding to this program specification command independently of the two device test programs.

3 Claims, 5 Drawing Sheets

FIG. 4A

```
a.tdl
------------------------------
int i = 0;
------------------------------
```

FIG. 4B

```
b.tdl
------------------------------
use "a.tdl";  - - - - - - - - - - - - - - -> i = 0

void main()
   {
    i =100;  - - - - - - - - - - - - - - - -> i = 100
    print i,'\n';  - - - - - - - - - - - - -> 「100」
   }
------------------------------
```

FIG. 4C

```
c.tdl
------------------------------
use "a.tdl";  - - - - - - - - - - - - - - -> i = 100

void main()
   {
    print i,'\n';  - - - - - - - - - - - - -> 「100」
   }
------------------------------
```

FIG. 5A

PRIOR ART

```
a.c
---------------------------
int i = 0;
---------------------------
```

FIG. 5B

PRIOR ART

```
b.c
---------------------------
#include "a.c"- - - - - - - - - - - - -> i =0

main()
    {
     i =100;- - - - - - - - - - - - - - -> i =100
     printf("%d \n", i);- - - - - - - - -> 「100」
    }
---------------------------
```

FIG. 5C

PRIOR ART

```
c.c
---------------------------
#include "a.c"- - - - - - - - - - - - -> i =0

main()
    {
     printf("%d \n", i);- - - - - - - - -> 「0」
    }
---------------------------
```

PROGRAM EXECUTING SYSTEM FOR SEMICONDUCTOR TESTING EQUIPMENT

BACKGROUND OF THE INVENTION

The present invention relates to a program executing system for semiconductor testing equipment that tests a DUT (device under test) based on a device test program for semiconductor testing equipment, and in particular, to a program executing system for semiconductor testing equipment that conducts tests based on a plurality of device test programs configured by commonly using a predetermined program file.

Conventionally, semiconductor testing equipment that carries out predetermined operation tests on various semiconductor elements is known. Examples of these semiconductor elements as DUT are semiconductor memory, logic IC and linear IC, etc., and these semiconductor elements are tested with semiconductor testing equipment suited to each of these semiconductor elements. This semiconductor testing equipment is used to conduct predetermined function tests and DC tests (DC parametric tests) by executing a predetermined device test program created by the user. This semiconductor testing equipment is connected to a workstation that creates a device test source program, which becomes the source of device test program, operates as an interface for the user to instruct various operations, displays and analyzes test results of the semiconductor testing equipment.

In general, a device test source program created by a workstation is subjected to interpretation of preprocessor commands as represented by a "#include" command of the C language and converted to a pre-processed source program by a preprocessor. The converted pre-processed source program is compiled and converted to a plurality of object file groups by a compiler. The plurality of compiled object file groups are subjected to linkage processing together with other object files by a linker and converted to a device test program, which is an execution file. Such a series of operations results in a device test program, which is executed by the semiconductor testing equipment. The semiconductor testing equipment operates based on this device test program and conducts predetermined tests on semiconductor elements.

Such semiconductor testing equipment is configured by including a tester control section that controls the operation of the entire semiconductor testing equipment, a tester that actually creates test signals, etc. under the control of this tester control section and supplies them to semiconductor elements, etc. and test heads on which the semiconductor elements are mounted. This semiconductor testing equipment normally includes two test heads and efficiently conducts tests by using both test heads alternately. If semiconductor elements of a same type are mounted on both test heads to conduct identical tests, these tests can be conducted by using a same device test program by simply alternating between the two test heads. Furthermore, if semiconductor elements of different types are mounted on the two test heads to conduct different tests, the semiconductor testing equipment stores two device test programs for their respective semiconductor elements in a program area of memory separately and selects one of them according to the test head.

However, if a device test source program is configured by using the above described "#include" command, a common file specified by this "#include" command is directly inserted into a specified location of the source program. The inserted common file is compiled as it is and converted to an object file. When the compiled device test program is executed by the semiconductor testing equipment, the common file is simply executed with the same inserted contents, and variables and functions, etc. defined by that common file are redefined every time it is executed. Therefore, the prior art stores a test result of a semiconductor element mounted on one of the two test heads as a variable or function defined by the common file, but the prior art is unable to reflect the test result in processing based on the device test program controlling a test of the semiconductor element mounted on the other test head. Moreover, if the program contents with variables and functions defined by the common file are changed due to execution of other files, the prior art is unable to reflect the changed contents of the program in the processing based on the device test program controlling a test of the semiconductor element mounted on the other test head, either.

SUMMARY OF THE INVENTION

The present invention has been achieved by taking into account the points described above and it is an objective of the present invention to provide a program executing system for semiconductor testing equipment capable of sharing a test result or changed contents of the program resulting from execution of the device test programs controlling their respective test heads.

The program executing system for semiconductor testing equipment according to the present invention includes first program supply unit that supplies a first device test program configured by including a program specification command specifying a common program as a test program for a DUT mounted on the first test head, second program supply unit that supplies a second device test program configured by including a program specification command specifying the common program as a test program for a DUT mounted on the second test head, and execution unit that, by inserting an intermediate code for a linkage to the common program specified by the program specification command at the positions of the program specification commands in the first and second device test programs, compiles the first and second device test programs and executes the common program independently of the first and second device test programs based on the intermediate code at the time of executing the compiled first and second device test programs above.

In particular, the execution unit includes compiling unit that compiles the first and second device test programs into the intermediate code group above and interpreter unit that interprets and executes the intermediate code group output from the compiling unit.

At the time of compiling the first and second device test programs, the program executing system according to the present invention inserts an intermediate code for a linkage to a common program, instead of simply developing and inserting a specified common program at the position as in case of compiling a "#include" command, which is a conventional program specification command. Then, at the time of executing the compiled first and second device test programs, the execution unit executes the common program linked by the intermediate code independently of the first and second device test programs. This allows the executed common program to become a different program independent of the first and second device test programs, and therefore even if the contents of the common program are changed, the changed contents are commonly reflected in the first and second device test programs. Furthermore, at the time of compiling the first and second device test programs, the program execution unit converts the entire program to an intermediate code group, and especially for the program specification command that especially specifies the common program, the program execution unit converts to an intermediate code for a linkage to the common program specified by the program specification command. Because of this the interpreter unit only needs to interpret and execute these intermediate codes.

It is particularly preferable that the compiling unit be provided on the workstation side, the interpreter unit be provided on the tester control section side, and the first and second device test programs be transferred from the workstation to the tester control section by unit of the intermediate code group. Since the compiling unit is provided on the workstation side, the tester control section need not perform compilation processing but perform interpreter processing on the intermediate code group, making it possible to reduce the processing load on the tester control section.

Furthermore, it is also preferable that a "use" command be used as the program specification command. At the time of writing the source processor of the tester control section in the C language, etc., using a special "use" command not used there makes it possible to differentiate it from the "#include" command.

BRIEF DESCRIPTION OF THE DRAWINGS

FIG. 4A, FIG. 4B and FIG. 4C illustrate an example of a device test source program created by the program creation apparatus in FIG. 2; and FIG. 5A, FIG. 5B and FIG. 5C illustrates a program example using a conventional "#include" command.

DESCRIPTION OF THE PREFERRED EMBODIMENT

With reference to the attached drawings, an example of a program executing system for semiconductor testing equipment according to an embodiment of the present invention will be explained below.

Figure 1:
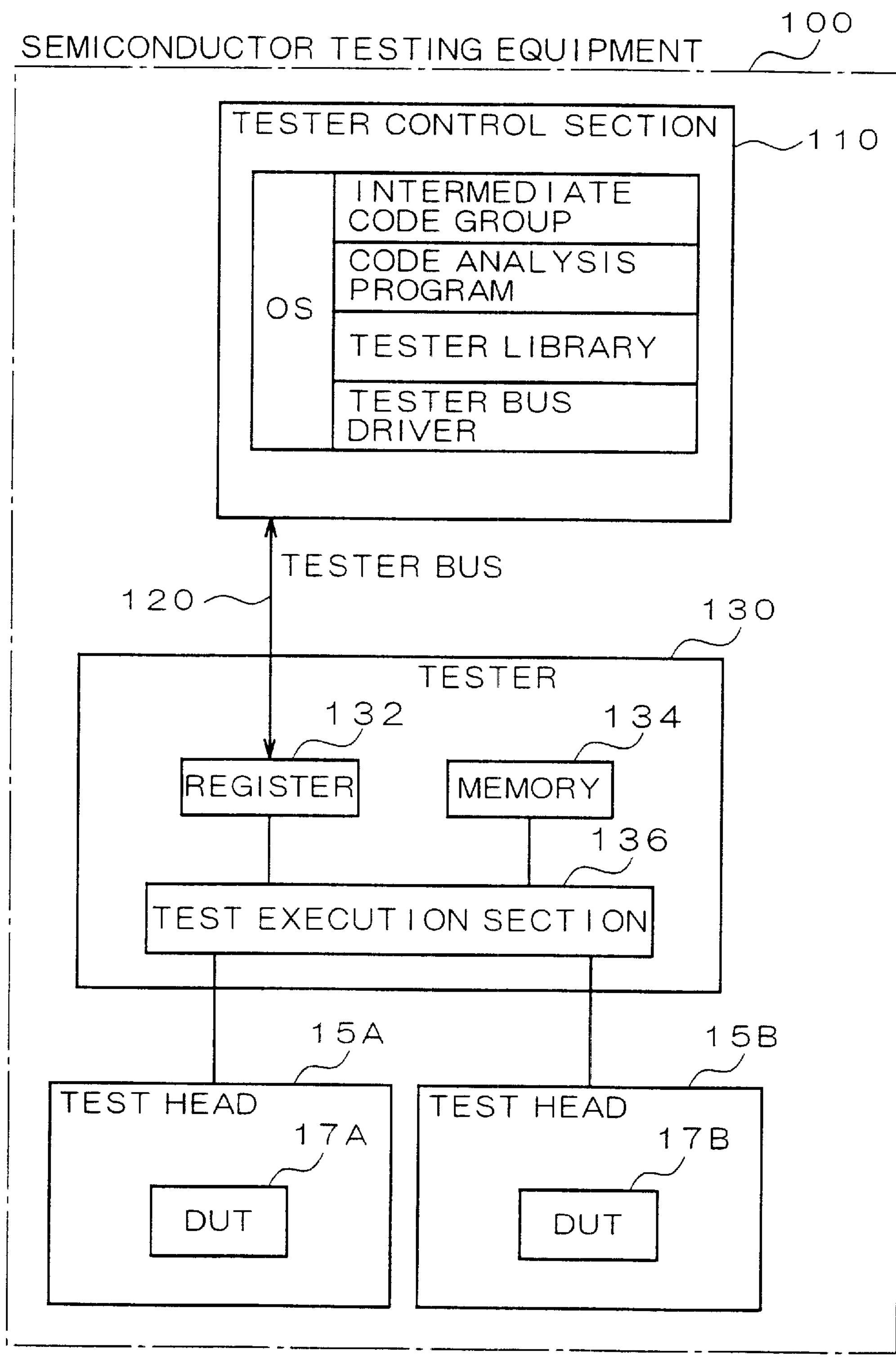
FIG. 1 illustrates an overall configuration of semiconductor testing equipment for which a device test program created by a program executing system for semiconductor testing equipment according to the present invention is executed.

FIG. 1 illustrates an overall configuration of semiconductor testing equipment for which a device test program created by a program executing system for semiconductor testing equipment according to the present invention is executed. The semiconductor testing equipment 100 shown in the figure is configured by a tester control section 110, a tester bus 120, a tester 130 and two test heads 15A and 15B. This semiconductor testing equipment 100 can conduct predetermined tests on two types of DUTs 17A and 17B using the two test heads 15A and 15B.

The tester control section 110 is intended to control the operation of the tester 130 and includes a tester bus driver that operates under a predetermined operating system (OS), a tester library, a code analysis program (interpreter) and an intermediate code group. The operating system used by the semiconductor testing equipment 100 of the present embodiment is a general-purpose system including at least a function of executing programs written in the C language.

Figure 2:
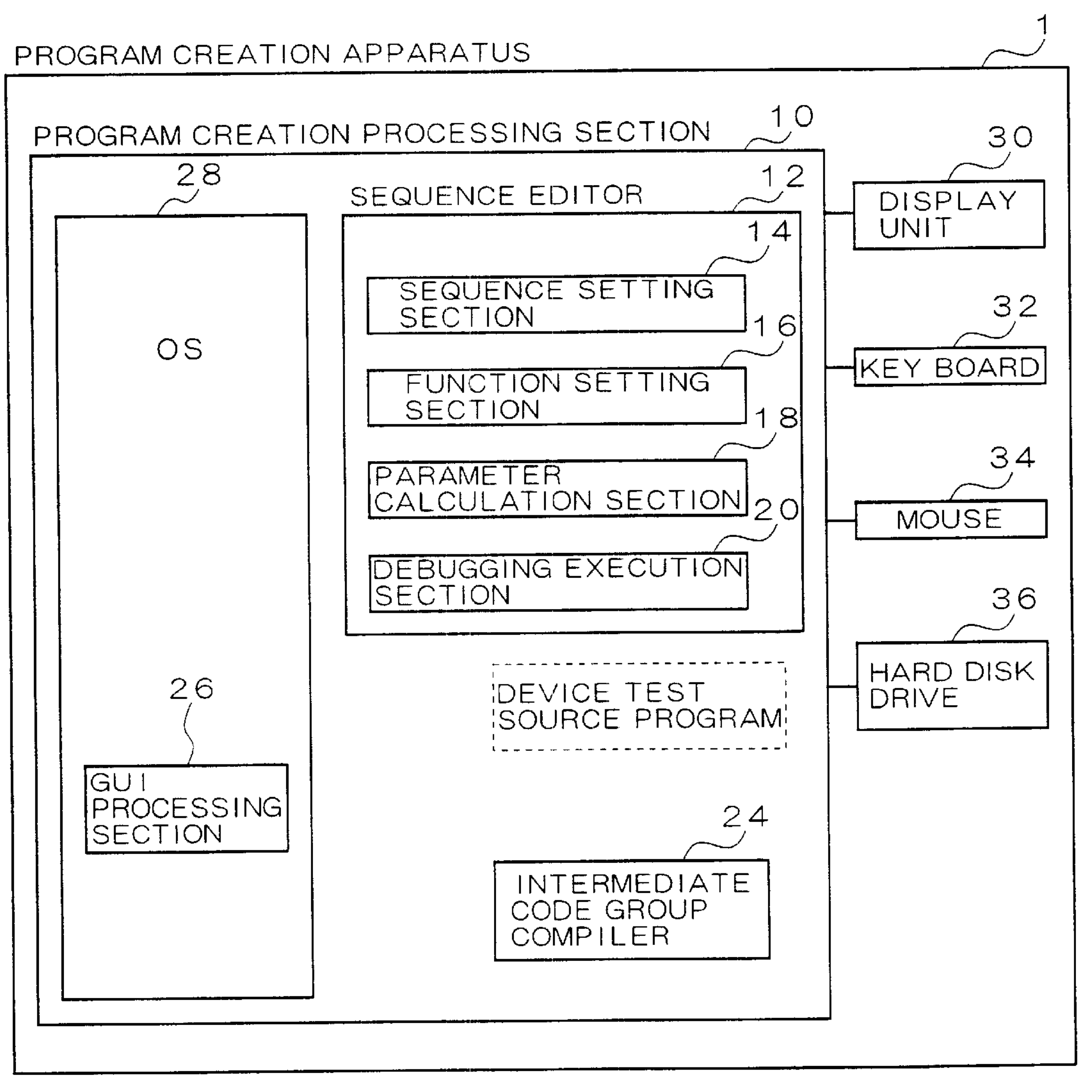
FIG. 2 illustrates an outlined configuration of a program creation apparatus that creates a device test program.
Figure 3:
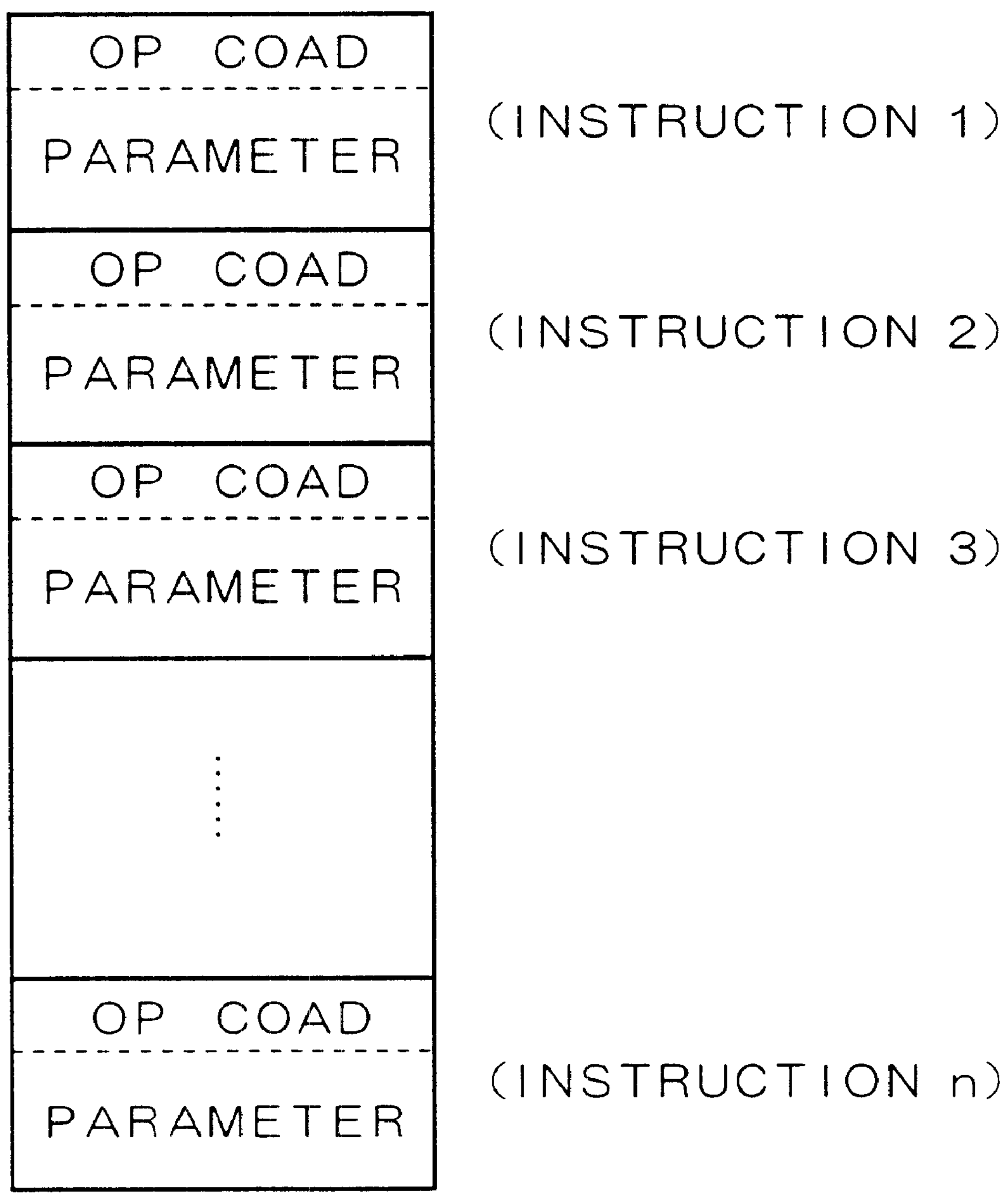
FIG. 3 illustrates a configuration of an intermediate code group of the device test program.

The intermediate code group is obtained by converting a device test source program created by the program creation apparatus 1 shown in FIG. 2 and provided as an object configured by a plurality of instructions 1, 2, . . . , n arranged in the order of execution as shown in FIG. 3. Each instruction is a combination of a predetermined operation code (hereinafter referred to as "OP code") corresponding to a function of the C language and a specific value of various parameters owned by this function. This parameter value set is a specific parameter value itself created for each function when an object program is created in the C language. As an operation code, not a C language function itself but a predetermined code which has a one-to-one correspondence with the C language function is assigned. The device test source program before it is converted to an intermediate code group describes what kind of tests the user wants to carry out on the DUTs 17A and 17B by using the semiconductor testing equipment 100 and its procedure and method. This device test program is generally created by the user of the semiconductor testing equipment 100.

When the device test program is executed, the code analysis program operates as an interpreter that parses of operation codes contained in each instruction of an intermediate code group and executes them one by one. The tester library converts each instruction of the intermediate code group after a parsing is performed by the code analysis program to a register-level instruction, creates and sets data necessary for the operation of the semiconductor testing equipment 100 and instructs the tester 130 to perform measuring operation. The tester bus driver is used to transmit/receive various data via the tester bus 120 and performs control such as sending various setting data necessary for function tests and DC tests to the tester 130 and receiving test results output from the tester 130.

The tester 130 shown in FIG. 1 is used to conduct various tests such as function tests, DC tests, RF tests (high frequency tests) on the DUTs 17A and 17B mounted on the two test heads under the control of the tester control section 110 and is configured by including a register 132, a memory 134 and a test execution section 136. The register 132 stores operation commands and various data transmitted/received to/from the tester library of the tester control section 110. Data stored in the register 132 is sent to the test execution section 136 directly or via the memory 134. The test result data output from the test execution section 136 is temporarily stored in the register 132 and memory 134, then sent to the tester library of the tester control section 110 via the register 132. The test execution section 136 includes various configurations (e.g., pattern generator, timing generator, DC unit, etc.) necessary to conduct function tests, etc. on the DUTs 17A and 17B and creates various signals to be actually input to the DUTs 17A and 17B and measures data appearing at the respective output pins of the DUTs 17A and 17B.

Then, the configuration of the program creation apparatus that creates a device test source program used by the above described semiconductor testing equipment 100 will be explained. FIG. 2 illustrates an outlined configuration of the program creation apparatus that creates a device test program. The program creation apparatus is normally connected to the semiconductor testing equipment 100 and is implemented by a workstation that inputs various operation commands from the user and displays test results.

As shown in FIG. 2, the program creation apparatus 1 according to the present embodiment includes a program creation processing section 10 implemented by a processor executing various programs stored in memory, a display unit 30 that implements a man-machine interface with the user who creates a device test program, a keyboard 32, a mouse 34 and a hard disk drive 36 that stores the created program.

The above described program creation processing section 10 has a sequence editor 12 that operates on a general-purpose operating system (OS) 28. This sequence editor 12 is configured by including a sequence setting section 14 necessary to create and edit a device test program, a function setting section 16, a parameter calculation section 18 and a debugging execution section 20 necessary to perform debugging of the device test program. The above described general-purpose OS 28 further includes a GUI (Graphical User Interface) processing section 26. This GUI processing section 26 operates to allow input/output of various data with the user through a GUI function in operations of the sequence setting section 14, the function setting section 16 and the debugging execution section 20 other than the parameter calculation section 18.

At the time of creating or debugging a device test source program by using the program creation apparatus 1, the user starts the sequence editor by clicking on the startup button of the sequence editor 12 displayed on a screen of the display unit 30 using the mouse 34. The user performs creation, editing and debugging of the device test source program by using the sequence editor 12. The device test source program created in this way is converted by the intermediate code group compiler 24 to an intermediate code group to be sent to the tester control section 110 of the semiconductor testing equipment 100. According to the program executing system according to the present embodiment, the workstation that operates as the program creation apparatus 1 compiles the device test source program into an intermediate code group and sends it to the semiconductor testing equipment 100, and thus the semiconductor testing equipment 100 only needs to interpret and execute the intermediate code group received by the code analysis program, which lightens the processing load.

The above described program creation apparatus corresponds to the first and second program supply unit, the test head 15A corresponds to the first test head, the test head 15B corresponds to the second test head, and the intermediate code group compiler 24 and the tester control section 110 correspond to the execution unit. Furthermore, the program creation processing section 10 corresponds to the compilation unit and the tester control section 110 corresponds to the interpreter unit.

FIG. 4A, FIG. 4B and FIG. 4C illustrate device test source program examples created by the program creation apparatus 1. FIG. 4A, FIG. 4B and FIG. 4C illustrate the contents of a first program "a.tdl", a second program "b.tdl" and a third program "c.tdl", respectively. Here, the first program "a.tdl" shown in FIG. 4A is used commonly by the second and third programs "b.tdl" and "c.tdl" as a common program. As apparent from FIG. 4B and FIG. 4C, the present embodiment defines a new program specification command, "use" command, instead of the C language "#include" command, specifies the common program based on it and describes the device test source program. The first program "a.tdl" shown in FIG. 4A includes a statement that sets variable "i" to "0". The second program "b.tdl" shown in FIG. 4B includes a statement that executes the first program "a.tdl" using the "use" command, sets "100" in variable "i" and prints the value of variable "i". The third program "c.tdl" shown in FIG. 4C includes a statement that executes the first program "a.tdl" using the "use" command and prints the value of variable "i".

The program specified by the "use" command is executed independently of the device test program. Therefore, variables and functions defined by the program specified by the "use" command are executed as independent programs. Therefore, the second program "b.tdl" and the third program "c.tdl" can commonly use the variable "i" defined by the first program "a.tdl". That is, the first program "a.tdl" specified by the "use" command is executed independently of the second program "b.tdl" and third program "c.tdl", and so if the contents of the variable "i" defined by the first program is changed by the second program "b.tdl" and or the third program "c.tdl", the changed contents is also reflected in other programs.

For example, if the second program "b.tdl" is executed first, the first program "a.tdl" is executed by the "use" command and the value of the variable "i" is set to "0". At this time, as indicated by the dotted arrow, the variable "i" comes to i=0. Then, the value of the variable "i" in the first program "a.dl" is changed from "0" to "100" by main processing of the second program "b.tdl". At this time, as indicated by the dotted arrow, the variable "i" becomes i=100. Then, if the third program "c.tdl" is executed, for the value of the variable "i" referenced in the third program "c.tdl", value "100" after it is changed by the aforementioned second program "b.tdl" is quoted as is. At this time, as indicated by the dotted arrow, the variable "i" is i=100. Therefore, the result of execution of the second program "b.tdl" is printed "100" as indicated by the dotted arrow and the result of execution of the third program "c.tdl" is also printed "100".

FIG. 5A, FIG. 5B and FIG. 5C illustrate program examples when the conventional "#include" command is used instead of the aforementioned "use" command. The contents of the first program "a.c" shown in FIG. 5A, the second program "b.c" shown in FIG. 5B and the third program "c.c" shown in FIG. 5C are basically the same as those in the first to third programs shown in FIG. 4A, FIG. 4B and FIG. 4C. However, even if the second program "b.c" described by the conventional "#include" command is executed, the first program "a.c" is only developed and inserted immediately before the second program "b.c" by "#include". That is, if the execution file compiled in the order of the second program "b.c" and the third program "c.c" is executed, "0" is defined as the value of variable "i" by the first program "a.c" inserted by "#include". At this time, as indicated by the dotted arrow, the variable "i" is i=0. Then, the value of the variable "i" is changed to "100" by execution of main processing of the second program "b.c". At this time, as indicated by the dotted arrow, the variable "i" becomes i=100. Then, the value of the variable "i" after the change is printed as indicated by a dotted arrow. Then, even if the third program "c.c" is executed, the value of variable "i" referenced in the third program "c.c" is totally different from the variable "i" changed by the second program "b.c" and "0" is newly defined as the value of variable "i" by execution of the first program "a.c". At this time, as indicated by the dotted arrow, the value of variable "i" is i=0. The value "0" of variable "i" is printed as is by execution of main processing of the third program "c.c" as shown by the dotted arrow.

The present invention is not limited to the above embodiment, but can be implemented with various modifications within the scope without departing from the spirit of the present invention. For example, the program creation apparatus 1 in the above described embodiment includes the intermediate code group compiler 24, but it goes without saying that this intermediate code group compiler 24 can also be provided on the side of the semiconductor testing equipment 100. Furthermore, the present embodiment explains the case where the "use" command is used as a command to specify another program, but it goes without saying that commands with other names can also be defined and used. Moreover, the above described embodiment explains the case where the program creation apparatus 1 is implemented by a workstation connected to the semiconductor testing equipment 100, but it is also possible to create a program by using a personal computer with GUI processing capability, etc.

As described above, the present invention has an effect of enabling test results and changed contents of a program obtained by executing the device test programs controlling their respective test heads to be commonly used between the device test programs.

What is claimed is:

1. A program executing system for semiconductor testing equipment, comprising:

first program supplying unit for supplying a first device test program configured by including a program specification command that specifies a common program as a test program for a DUT, which is mounted on a first test head;

second program supplying unit for supplying a second device test program configured by including a program specification command that specifies said common program as a test program for a DUT, which is mounted on a second test head;

execution unit for compiling said first and second device test programs by inserting an intermediate code for a linkage to said common program specified by said program specification command at the position of said program specification command in said first and second device test programs and executing said common program based on said intermediate code independently of said first and second device test programs when executing said compiled first and second device test programs, wherein said execution unit comprises:

compiling unit for compiling said first and second device test programs into an intermediate code group including said intermediate code; and interpreter unit for interpreting and executing said intermediate code group output from said compiling unit.

2. The program executing system for semiconductor testing equipment according to claim 1, wherein said compiling unit is provided on the workstation side;

said interpreting unit is provided on the tester control section side; and said intermediate code group transfers said first and second device test programs from said workstation to said tester control section.

3. The program executing system for semiconductor testing equipment according to claim 1, wherein a "use" command is used as said program specification command.

* * * * *